United States Patent [19]

Schafer et al.

[11] Patent Number: 5,006,920
[45] Date of Patent: Apr. 9, 1991

[54] ELECTRICAL COMPONENTS

[75] Inventors: Wolfgang Schafer, Bad Vilbel; Hans Isert, Rodermark, both of Fed. Rep. of Germany

[73] Assignee: Telenorma Telefonbau und Normalzeit GmbH, Frankfurt am Main, Fed. Rep. of Germany

[21] Appl. No.: 168,698

[22] Filed: Mar. 16, 1988

[30] Foreign Application Priority Data

Mar. 18, 1987 [DE] Fed. Rep. of Germany ....... 3708789
Oct. 20, 1987 [DE] Fed. Rep. of Germany ....... 3735455

[51] Int. Cl.$^5$ ...................... H01L 23/02; H01L 23/12
[52] U.S. Cl. ........................... 357/74; 357/80; 357/68
[58] Field of Search ............................ 357/74, 80, 68; 174/68.5; 361/395, 412, 414

[56] References Cited

U.S. PATENT DOCUMENTS

| 3,832,603 | 8/1974 | Cray et al. | 317/101 |
| 4,125,935 | 11/1978 | Ammon | 29/629 |
| 4,754,316 | 6/1988 | Reid | 357/56 |

FOREIGN PATENT DOCUMENTS

| 1218568 | 6/1966 | Fed. Rep. of Germany . | |
| 1279148 | 10/1968 | Fed. Rep. of Germany . | |
| 2459532 | 12/1975 | Fed. Rep. of Germany . | |
| 2354260 | 10/1979 | Fed. Rep. of Germany . | |
| 739828 | 11/1955 | United Kingdom . | |
| 1149322 | 4/1969 | United Kingdom . | |
| 2138998 | 10/1984 | United Kingdom | 357/74 |
| 59-100556 | 6/1984 | Japan . | |
| 59-117254 | 7/1984 | Japan . | |
| 0229847 | 12/1984 | Japan | 357/74 |
| 0079750 | 5/1985 | Japan | 357/74 |
| 0136358 | 7/1985 | Japan | 357/74 |
| 61-54656 | 3/1986 | Japan . | |
| 0283647 | 12/1987 | Japan | 357/74 |
| 0153845 | 6/1988 | Japan | 357/74 |
| 739828 | 11/1955 | United Kingdom . | |

OTHER PUBLICATIONS

Peter Kastner, "Halbleiter Technologie, Vogelverlag 1980", pp. 91-103.
Gunter Kas, "Schichtelektronick, Lexika-Verlag 1978", pp. 55-74.
Petersen, "Silicon as a Mechanical Material", Proceedings of the IEEE, vol. 70, No. 5, May, 1982.

Primary Examiner—Rolf Hille
Assistant Examiner—Hoanganh Le
Attorney, Agent, or Firm—Marmorek, Guttman & Rubenstein

[57] ABSTRACT

An electronic modular unit such as an integrated semiconductor unit is disclosed. The inventive electronic unit can be bonded to a support or to another modular unit. For this purpose, the inventive unit is provided with projections or recesses so that units can mate with one another. The projections may be formed by an etching process. Electrical connections as well as mechanical connections between units may be achieved using the projections and recesses.

9 Claims, 2 Drawing Sheets

ELECTRICAL COMPONENTS

BACKGROUND OF THE INVENTION

The present invention relates to electronic modular units such as integrated semiconductor units which can be mechanically bonded to another unit such as a support or another modular electronic unit.

FIELD OF THE INVENTION

Over the past few years electronic modular units have become progressively smaller. This applies to modular units in the integrated semiconductor technology as well as to modular units in the thick-film and thin-film technology. Thus the dimensions of a multi-layer ceramic capacitor in the thick-film technology for example, or a corresponding resistor may measure less than one square millimeter in surface. This also applies to semiconductor chips.

The modular micro-units mentioned above are typically mounted on a metal, ceramic or plastic support. Such mounting may be accomplished by means of alloying, soldering or gluing. For further details, see Peter Kästner, "Halbleiter Technologie, Vogelverlag 1980" and Günter Käs, "Schichtelektronik, Lexika-Verlag 1978", both of which are incorporated herein by reference.

The mounting of the above-mentioned modular micro-units on a support involves considerable difficulty because of the small dimensions. As a rule the mounting procedure involves mechanically mounting a chip incorporating an integrated circuit on a support to which electrical connections are also made. The electrical connections are formed by bonding to contact points of the chip, which contact points are generally made of aluminum. This bonding is very expensive. Illustratively, the micro-unit contains a circuit on one surface thereof and the opposite surface is bonded to the support.

In view of the foregoing, it is an object of the present invention to provide a modular electronic micro-unit which can be economically bonded to another unit such as a support or another modular electronic micro-unit.

SUMMARY OF THE INVENTION

In accordance with the present invention, etching techniques known from semiconductor technology are utilized to form projections on one of two units to be bonded. Corresponding recesses on the other of the two units to be bonded are also created by means of appropriate etching techniques so that the two elements can be plugged into each other. Because the resulting connection or bond is mechanical, the two units may later be separated. Illustratively, the units to be bonded are integrated semiconductor units. An integrated semiconductor unit may be bonded to a support or to another integrated semiconductor unit using the technique described above.

Appropriate etching techniques are sufficiently well known from semiconductor technology. The application of etching techniques used in semiconductor technology for the purpose of solving mechanical problems is known from the literature (e.g. see *Proceedings of the IEEE*, Vol. 70, No. 5, May 1982, which is incorporated herein by reference). Thus etching techniques may be used to form mating structures such as projections and recesses in semiconductor bodies so that they may be bonded.

In accordance with the invention, it is possible to plug a modular micro-unit provided with projections, such as a modular semiconductor unit, into a support equipped with corresponding recesses produced by an etching technique. In some cases however, it may be preferable to provide a modular unit with recesses and to form the corresponding projections on the support.

In an alternative embodiment of the invention and where permitted by the size of the modular micro-unit, the projections formed on the modular micro-unit could engage recesses on the support that were formed by methods other than etching, e.g. drilling and burning out by means of laser radiation. Such techniques are especially recommended for supports that are difficult to etch or cannot be etched at all, e.g., supports made from plastic or certain metals.

The material used for the support can be the same material as that of which the modular electronic micro-unit itself is made, e.g. silicon, gallium arsenide, ceramic or a similar material. The modular electronic micro-units of the present invention may be connected to form a multiple layer structure. This makes it possible to obtain a fairly high packing density. Such bonding technology also offers the advantage that modular units which have already been tested can be bonded to each other in a tight package so that greater yield may be expected in the circuit to be produced. Because connected units can later be separated, increased flexibility is afforded in the design of the overall circuit and for repairs.

In an advantageous further embodiment of the invention it is recommended to fashion the projections in the form of truncated cones and the corresponding recesses in the form of cylinders. The cylinders could for instance be circular cylinders against which the slanted circumferential surfaces of the conical projections are wedged in a bond. To obtain better bonding however, the cross-sectional surfaces of the recesses and of the projections could have different geometrical configurations such as for example a circle and a square, etc. When they are plugged into each other, essentially linear bonding surfaces result, such bonding surfaces ensuring good mechanical contact between the two elements to be bonded.

Because of their small dimensions, the modular electronic micro-units which sometimes handle considerable loads and overheat. In that case it is recommended to leave a cavity for cooling purposes between the two opposing surfaces of the units to be bonded to each other. The configuration of the two units to be bonded to each other is such that a considerable space is provided between the surfaces which face each other in bonded position so that a cooling medium such as air or water is able to flow through the space. Illustratively, the projections of a modular micro-unit plugged into the recesses of a support serve as spacers between the support and modular unit as well as bonding mechanisms. An appropriate configuration of projections and recesses make it possible to create the appropriate channels through which fluids can be made to flow.

In a further embodiment of the invention it is recommended to provide the surfaces of the projections and recesses with electrically conductive layers so as to exploit the mechanical connection of two units for simultaneously achieving electrical connections as well. In this case the conductive layer can be created by doping, vacuum metallization, diffusing or similar techniques. Thus, a circuit incorporated in a first unit is connected to the projections formed integrally therewith. The projections of the first unit are received in recesses of a second unit which recesses are electrically connected to a circuit in the second unit. Thus, a mechanical connection is achieved between the two units as well as an electrical connection. For example, an integrated semiconductor unit incorporating an integrated circuit can be mechanically and electrically connected to a support which itself contains a circuit.

Isotropic etching is the recommended etching technique for projections or recesses which are to be given round cross-sections while anisotropic etching is recommended for projections or recesses to be given square cross-sections.

DETAILED DESCRIPTION OF THE INVENTION

Figure 1:
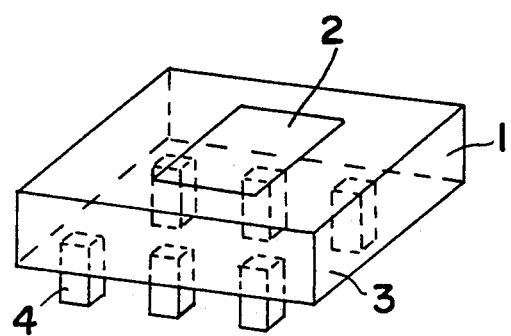
FIG. 1 shows a substrate equipped with projections in accordance with an illustrative embodiment of the present invention.

The substrate 1 shown in FIG. 1 is a modular micro-unit in which an electronic circuit 2 is incorporated. The substrate is made of silicon and has projections 4 at its lower surface which are essentially in the form of paralellepipeds formed integrally with the substrate. For example, the projections may be formed by etching the substrate. The projections 4 are connected to appropriate electrical points of the circuit 2 by electrical conductor paths (not shown) running through the substrate.

The support 6 is provided with recesses 5 corresponding to the projections 4. The recesses 5 may be conically tapered. The support 6 can be considered to be a portion of a larger modular unit or an independent modular micro-unit carrying its own electrical circuit located on the surface of the support 6 not shown in FIG. 1 (i.e. on the underside). For instance, the support may be a large wafer capable of supporting several substrates such as substrate 2 of FIG. 1. The inner surfaces of the recesses 5 of the support 6 may be connected in a suitable manner to an electric conductor built into the surface 6 or may be suitably connected among themselves so that the connections act as the wiring of a printed circuit.

When substrate 1 is plugged into support 6, the projections 4 extending into recesses 5 not only ensure mechanical bonding between the substrate and support but also ensure proper electrical connections.

Illustratively, the recesses may be formed in a conical shape. The conical angles of inclination of recesses 5 are designed so that when the substrate 2 and support 6 are held together a space is provided between the two opposing surfaces 3 and 7, it being possible to utilize this space for cooling purposes by causing a cooling fluid or a cooling stream of air to flow between the surfaces. As indicated above, to use the projections and recesses to form electrical connections, it is desirable to form a conductive layer on the surfaces of the projections and recesses. Alternatively, to use the projections, for example, to form electrical connections, it is possible to dope the substrate by diffusion of appropriate doping material at appropriate locations before the projections are etched. The use of the same structures to provide both mechanical and electrical interconnection results in space savings of up to 50%.

In a three-dimensional structure of integrated circuits made of identical or different materials, the required contact points and connecting paths can be built into the substrates as mentioned earlier and excessively long metallizing paths can be avoided. Furthermore, wafers structured as conducting paths on which the pluggable modular micro-elements can be directly placed may be used to form printed circuits. The combination of units formed from different materials is also possible in accordance with the invention, as long as the units have been appropriately structured in advance with projections or recesses by means of etching or other processes.

Figure 2:
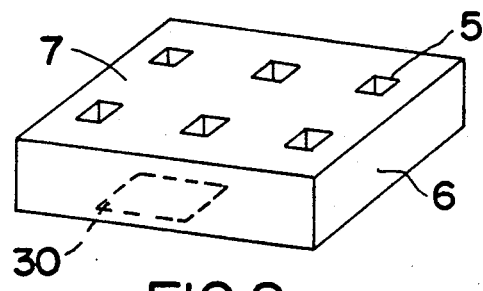
FIG. 2 shows a support with recesses corresponding to the projections of the substrate of FIG. 1 in accordance with an illustrative embodiment of the present invention.
Figure 3:
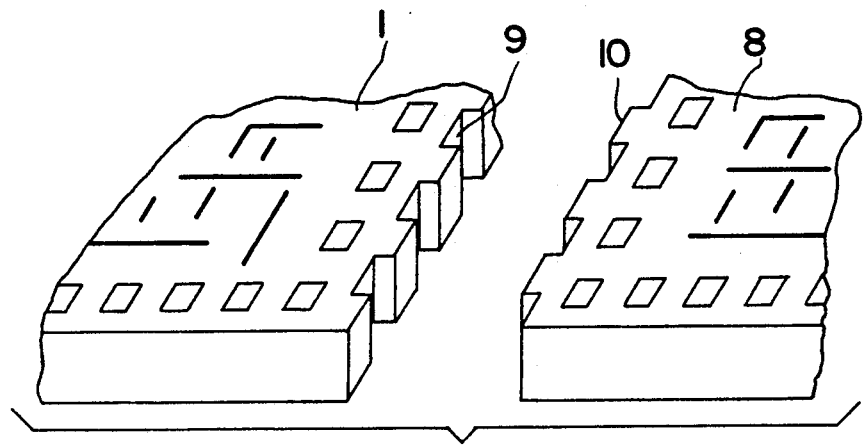
FIG. 3 shows an alternative mechanism for joining two substrates in accordance with an alternative illustrative embodiment of the invention.
Figure 4:
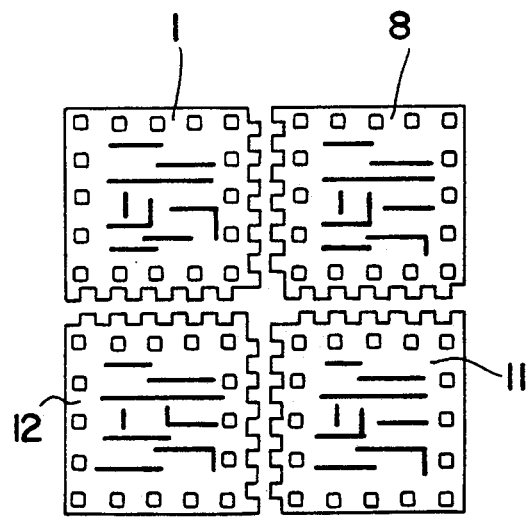
FIG. 4 shows the mosaic-like joining of several substrates using the connection mechanism of FIG. 3.

It is not only possible to combine units when they are located one above the other as shown in FIGS. 1 and 2, but, as shown in FIGS. 3 and 4, the combination of two or more substrates 7,8 lying in one and the same plane is made possible by the invention by providing appropriate lateral surfaces with recesses 9 or projections 10. Illustratively, each of the substrates 7,8 incorporates an electronic circuit as shown in FIGS. 3 and 4. Two or more substrates can be bonded to each other via these recesses 9 and projections 10 temporarily or permanently, whereby the arrangement of substrates produced in this manner is attached on a further substrate by means of an adhesive, by "anodic bonding" or by means of projections etched out on the underside of the chip as shown in FIGS. 1 and 2. Electrical connections between the two substrates can be established by means of metallic contact points formed at the recesses 9 or projections 10. These contact points are connected to the electrical circuits on the substrates. A further possibility for the establishment of electrical connections between two substrates bonded to each other by mechanical means can also be realized by providing electric connection points in the area of the lateral surfaces equipped with the projections 10 or the recesses 9 (e.g. on the upper surface of the substrate near the projections or recesses) to be used to connect wires by welding or soldering. The mechanical bonding of two substrates in one plane can also be used to dissipate heat, whereby heat is produced on one substrate for example, and whereby the radiating surface is enlarged by the mechanically bonded substrate. In that case electrical connections are not absolutely necessary. In the embodiment shown in FIG. 4 it is assumed that four substrates 1, 8, 11 and 12 are bonded to each other in order to thus constitute an integrated circuit. It should further be noted that the substrates do not necessarily have to be made of the same material but may also be made of different materials so that the integrated circuits can be produced by using different technologies.

Finally, the above-described embodiments of the invention are intended to be illustrative only. Numerous alternative embodiments may be devised by those skilled in the art without departing from the spirit or scope of the following claims.

We claim:
1. In combination, a first modular micro-electronic unit comprising
a first substrate,
a first electronic circuit incorporated at a first major surface of said first substrate, and
first etched mechanical mating means formed integrally with said first substrate at a second major surface of said first substrate oppositely disposed from said first major surface, and
a second modular micro-electronic unit comprising a second substrate and second etched mechanical mating means formed on a major surface of said second substrate,
said first and second mechanical mating means mating with each other to form a mechanical bond between said first and second modular micro-electronic units,
wherein said first and second mating means include an electrically conducting material, said first and second mating means mating together to form both an electrical bond and a mechanical bond between said first and second micro-electronic units.

2. The combination of claim 1 wherein said first and second substrate are formed from a semiconductor material.

3. The combination of claim 1 wherein said first and second substrate are formed from a ceramic material.

4. The combination of claim 1 wherein said first and second substrates are formed from different materials.

5. In combination,
a first integrated semiconductor electronic unit comprising
a first semiconductor substrate,
a first integrated circuit incorporated integrally in said first semiconductor substrate,
first mechanical mating means formed integrally with said first semiconductor substrate on a major surface thereof, and
a second integrated semiconductor electronic unit comprising a second semiconductor substrate, a second integrated circuit incorporated integrally in said second semiconductor substrate and second mechanical mating means formed integrally with said second semiconductor substrate on a major surface thereof,
said first and second mating means mating with each other to form a mechanical bond between said first and second semiconductor electronic units,
wherein said first and second mating means include an electrically conducting material, said first and second mating means mating together to form a mechanical bond and an electrical connection between said first and second semiconductor electronic units.

6. The combination of claim 5 wherein said first and second mating means are etched.

7. The combination of claim 5 wherein said first mating means comprises projections formed integrally with said first substrate and said second mating means comprises recesses formed integrally in said second substrate.

8. The combination of claim 5 wherein said first mating means comprises projections and said second mating means comprises recesses, said projections and recesses fitting together to form a space between said units used for cooling purposes.

9. The combination of claim 5 wherein said first mating means is electrically connected to said first circuit.

* * * * *